United States Patent [19]

Engan

[11] Patent Number: 4,649,509

[45] Date of Patent: Mar. 10, 1987

[54] SURFACE ACOUSTIC WAVE CONVOLVER ARRANGEMENT WITH CLOSELY SPACED IMPEDANCE MATCHED INPUT TRANSDUCERS

[75] Inventor: Helge Engan, Trondheim, Norway

[73] Assignee: Siemens Aktiengesellschaft, Berlin and Munich, Fed. Rep. of Germany

[21] Appl. No.: 636,928

[22] Filed: Aug. 2, 1984

[30] Foreign Application Priority Data

Aug. 19, 1983 [DE] Fed. Rep. of Germany ....... 3330034

[51] Int. Cl.[4] ........................ G06G 7/12; H01L 41/04; H03H 9/00

[52] U.S. Cl. ................................ 364/821; 310/313 C; 310/313 D; 333/196

[58] Field of Search .................... 364/821; 310/313 R, 310/313 H, 313 B, 313 C, 313 D; 333/193, 195, 196

[56] References Cited

U.S. PATENT DOCUMENTS 4,298,849 11/1981 Arneson ............................ 333/196
4,473,888 9/1984 Smith ................................ 364/821

*Primary Examiner*—E. A. Goldberg
*Assistant Examiner*—Mark Reinhart
*Attorney, Agent, or Firm*—Hill, Van Santen, Steadman & Simpson

[57] ABSTRACT

A surface acoustic wave-convolver arrangement having transducers whose fingers are curved such that they correspond to a respective wave front of a wave issuing from the integration electrode.

6 Claims, 6 Drawing Figures

SURFACE ACOUSTIC WAVE CONVOLVER ARRANGEMENT WITH CLOSELY SPACED IMPEDANCE MATCHED INPUT TRANSDUCERS

BACKGROUND OF THE INVENTION

The present invention relates to a surface acoustic wave convolver arrangement wherein an integration electrode is provided on the substrate acting as a waveguide. Interdigital input transducers are provided along with the integration electrode.

Convolver arrangements which operate with surface acoustic waves (SAW) are known from the prior art. Reference is made in this regard to the following publications: 1. IEEE Ultrasonics Symposium (1981), page 186, ff.; 2. IEEE Ultrasonics Symposium (1980), page 59 ff.; 3. IEEE Transactions on Sonics and Ultrasonics, Volume 30 (1983), page 43 ff.; 4. EU-A 00 57 332, all incorporated herein by reference.

From publication 1., an arrangement with the integration electrode provided on a substrate wherein the integration electrode functions as a waveguide. At ends of the waveguide first and second input transducers are provided. The input transducers are interdigital finger structures with bus bars. Publication 1 discloses and illustrates an integration electrode designed as a waveguide which is a continuous metallization coating of the surface of the substrate member not illustrated therein. Opposite the right and the left end of the waveguide, one input transducer each is illustrated whose aperture, given by the overlapping length of the interdigitally arranged fingers of this transducer, is equal to the width of the respective opposite end, i.e. is equal to the width of the metallization strip. As is apparent, the two input transducers have nonequidistant spacings of the interdigitally arranged fingers, corresponding to the necessary dispersion property of the transducers. The dispersion of the two transducers can be selected to be of varying size, whereby a dispersion of the waveguide can be compensated.

With a convolver arrangement as described above and also with other convolver arrangements, in the case of one input signal each which is applied to the respective input transducers, in the region of the integration electrode a mixed product of the input signals can be produced which—as is illustrated in publication No. 1—can be taken from the integration electrode. A prerequisite for the occurrence of such a mixed product is that in the region of the integration electrode, a nonlinear property for the sonic waves travelling therein produced by the respective input transducer be present. This signifies that the input transducers, approximately comparable to other surface acoustic wave arrangements, must produce a very high-intensity sonic wave in the surface of the substrate in the region of the integration electrode. Accordingly, for such convolver arrangements, the problem exists of being able to introduce high-intensity surface waves produced in the respective input transducer into the opposite end of the waveguide of the integration electrode. This comprises the additional problem of generating a high-intensity sonic wave in the transducer. For this purpose, a precondition is that the transducer be optimally adapted in terms of impedance to the impedance value which is usually specified at the output of that particular electronic circuit to which the respective input transducer is connected.

The impedance value of an input transducer as employed results essentially from its radiation resistance and its interelectrode capacitance. For this reason alone, the respective input transducer cannot be arbitrarily dimensioned. On the other hand, the wave transmitted by the transducer into the integration electrode must strike the wave in as optimum a fashion as possible, i.e. the transmitting characteristic of the respective transducer must be matched to the receiving characteristic of the opposite end of the integration electrode.

For the arrangement illustrated in of publication 1., through correspondence of the apertures, this above-stated matching is to be effected. Through the design of the input transducer as a dispersive transducer, the demands of the generation of intense sonic waves (through corresponding lengths, or finger number, respectively, of the transducer) can also be complied with.

In the arrangement illustrated in publication 2., this problem is solved through use of input transducers together with beam compressors, separated therefrom. The input transducers have very long fingers so that the aperture of the input transducer is far greater than the aperture of the integration electrode. The above-described beam compressor is intended to match the very different apertures to one another.

Publication 3. describes, and illustrates, a convolver arrangement with input transducers which have curved finger electrodes. The finger electrodes have a uniform curvature which is so selected that the respective input transducer has a focusing property for the sonic wave generated in the transducer. The length of the individual interdigitally arranged fingers of the respective input transducer is uniformly great. The arrangement requires a considerably large surface.

Publication 4., illustrates a convolver arrangement not relevant per se for the invention but which is described in the following. Finger electrodes are shown therein which, instead of a rectilinear shape, have a finger shape which results in a certain finger offset. However, it must be pointed out that, in the region of the aperture of the integration electrode, the fingers which, as a whole, are not rectilinear, are still rectilinear and the bends of its shape lie only outside the aperture. Bent fingers also occur only in the case of the beam compressor. The input transducers have the conventional rectilinear design of the interdigitally arranged fingers.

Initially, the problems were already pointed out which arise in the case of a convolver arrangement from the demand for generating high-intensity sonic waves on a narrow aperture (of the integration electrode) in a concentrated fashion.

SUMMARY OF THE INVENTION

It is an object of the present invention to disclose an improved arrangement as compared with the prior art by which sufficiently high-intensity sonic waves can be optimally coupled into the integration electrode, whereby there is sufficient freedom with respect to the parameters which determine the impedance. This object is achieved for a surface acoustic wave convolver arrangement wherein the interdigital input transducer has a plurality of fingers deviating from linear shape such that they are each curved. The curved fingers when viewed from the end adjacent the integration electrode are concave and respectively have a curvature at least approximately corresponding to a wave front (at the location of the respective finger) of a sonic wave which could proceed therein starting from the end of the integration electrode and which would have said predetermined wave mode, which is to be produced by the respective transducer to which the respective finger belongs. Opposite poled adjacent curved fingers overlap with one another and the respective overlapping is dimensioned so that in a primary section of the transducer a maximum receiving sensitivity is provided for said sonic wave.

An object underlying the invention consists in selecting several dimensioning sizes, selectable independently of one another per se, for individual components of a convolver arrangement. The dimensioning sizes are matched to one another such that the stated objective is optimally achieved. This inventive dimensioning, matched to one another, of the cited parameters is based on the considerations to be explained in the following which, moreover, also serve the purpose of enabling the expert to understand the invention without difficulties and to copy it with undoubted success (without needing to make additional special considerations).

Basically, a continuously curved shape of the interdigitally arranged fingers of the input transducer could be provided. However, it is technologically more advantageous, and delivering virtually the same technical result in accordance with an embodiment of the invention to select the shape of the individual fingers such that they consist of rectilinear finger pieces constantly joined to one another. This preferred embodiment thus exhibits fingers which possess the shape of a polygon curve. In regions of a slighter curvature of the specified curvature progression (to be explained in greater detail in the following) the corresponding polygon sections can be dimensioned in relatively large fashion. This means approximation to the optimum curvature.

In connection with finger shapes in the manner of a polygon curve which, in accordance with this embodiment, is matched to a specified constant curvature progression, it must be additionally pointed out that the position of the polygon pieces inevitably differing in relation to the exact curvature can also enter into, or influence in the weighting of the individual fingers. Thus, in the case of this embodiment, also a desired or necessary finger weighting can be jointly included.

DESCRIPTION OF THE PREFERRED EMBODIMENTS

Figure 1:
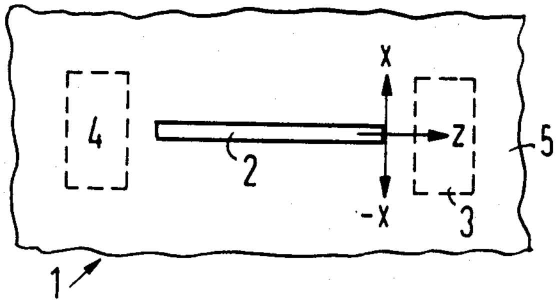
FIG. 1 illustrates a schematic view of a convolver arrangement.

FIG. 1 shows a schematic illustration of a convolver corresponding to the present invention. Reference numeral 1 designates the entire convolver arrangement which has an integration electrode 2 and input transducers 3 and 4. The integration electrode 2 and the transducers 3 and 4 are disposed on the surface of a substrate 5 of piezoelectric material illustrated only in section fashion. With z and ±x, axial directions of the plane coinciding with the surface of the substrate 5 are indicated.

Figure 2:
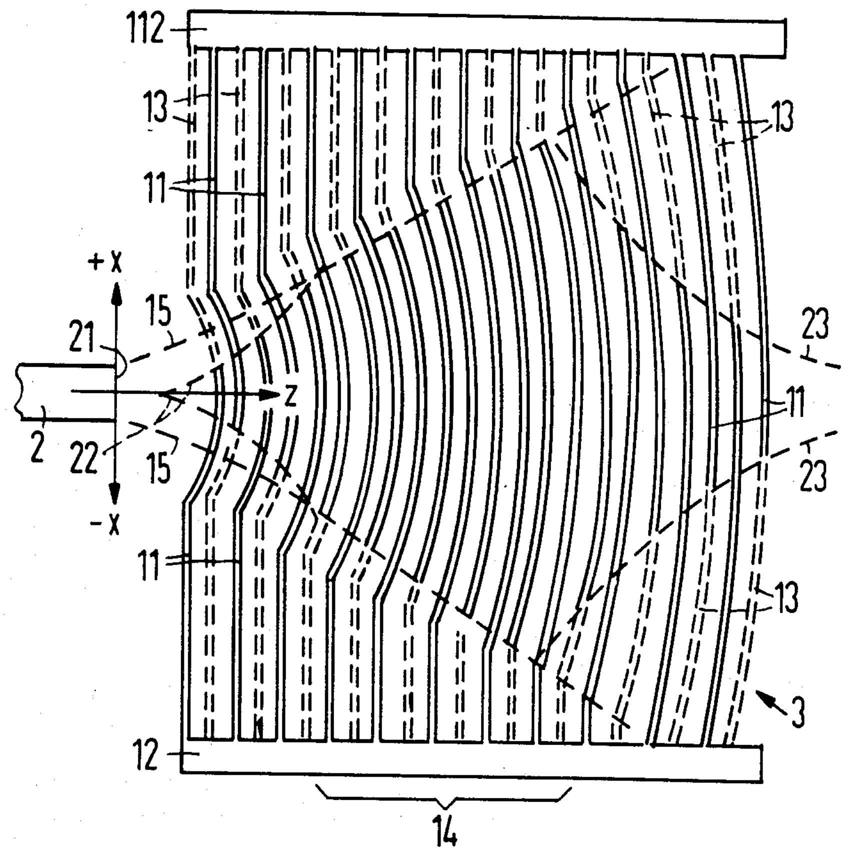
FIG. 2 illustrates a sectional representation of an input transducer designed according to the invention.

FIG. 2 shows a section of FIG. 1, namely the right end 21 of the integration electrode 2 and the input transducer 3 opposite the end 21. The illustration of FIG. 2 is substantially enlarged in relation to FIG. 1 and is supplemented by additional details.

Just like the transducer 4, the illustrated input transducer 3 in the case of the invention is a dispersive transducer in which the spacings of the fingers 11 from one another, measured on the axis z, are non-equidistant. The use of different spacings to create a dispersive transducer, is of course known, as discussed above with respect to publication No. 1. The spacings are dimensioned of varying size corresponding to the respective wavelength range of the dispersion. These varying finger spacings for a dispersive transducer are not taken into account in FIG. 2 (particularly for reasons of clarity since the spacing deviations are small in relation to the drawing FIG. 2 as a whole).

As is apparent from FIG. 2, the transducer 3 has fingers referenced 11 which, together with adjacent fingers 11, overlap for at least a portion of the length of said fingers. This overlapping length is that particular respective length proportioned in the case of two adjacent fingers 11 for which an electric interaction between the fingers, and hence, for the entire transducer, is present. As a finger pair, two such fingers 11 are viewed of which the one finger 11 is connected with the one bus bar 12 and the other finger 11 is connected with the oppositely poled other bus bar 112. This alternate electric connection of the fingers 11 with the bus bar 12 and 112 is apparent from FIG. 2.

Reference numeral 13 designates additional fingers present in the transducer 3. These fingers 13 are illustrated in broken lines for the purpose of an optical distinction; namely, from the fingers 11. In practice, the fingers 13 are metallization strips like the metallization strips of fingers 11. The physical difference between the fingers 13 and the fingers 11 is that the individual fingers 13 each have no adjacent finger which is connected with the oppositely poled bus bar 12 or 112. For such fingers 13, accordingly there is also no overlapping length, and the fingers 13 are electrically inactive. They are also designated as dummy fingers. As is known, these fingers 13 are provided for the purpose of uniformity of wave propagation.

Insofar as there is discussion of inventive curvature of fingers and of inventive length dimensioning (of the overlapping length) of fingers with regard to this invention, such fingers 11 as described above are meant; i.e. the overlapping length of pairs of such fingers 11 (since the fingers 13 can also be virtually omitted for the electric function of the transducer).

The curvatures or polygon curves of the shape of the fingers 11 and their length, or overlapping length, respectively, to be provided for the invention, can be provided for all fingers 11 of a respective transducer 3, 4. However, as is apparent, the idea of the invention is also already realized if only a substantial number of all fingers 11 are shaped and/or dimensioned according to the invention. Individual fingers 11 not corresponding to this specification do not prevent the occurrence of the inventive effect of the remaining fingers 11 of the respective transducer.

As a further important term, "primary section" must be defined. What is meant thereby (viewed in direction of the axis z) is a proportion of the transducer (3 or 4) which has inventively shaped and dimensioned fingers 11 and which already delivers the inventive result to a substantial extent. Preferably, the primary section of the transducer 3 is the center portion of the respective transducer.

It has been shown that, aside from the result to be obtained in accordance with the invention, additional advantages can be achieved if one allows the respective extent of the overlapping length of pairs of the fingers 11 of the transducer 3, in the direction of the end 21 of the integration electrode 2, to converge to a small value, particularly to zero. It has also been shown to be advantageous to provide a corresponding convergence of the overlapping lengths of the fingers 11 for the oppositely disposed other end of the transducer 3.

In FIG. 2, the portion of the transducer 3, defined as the primary section, is emphasized with primary section 14. In this primary section 14, the overlapping length of the fingers 11 are optimally of such a size that they cover the intermediate space between the envelope curves 15. Hereafter, these envelopes 15 shall be discussed in greater detail.

In the sectional view of transducer 3 shown in FIG. 2, in the portion of the primary section 14, i.e. the portion between the primary section 14 and the end 21, the overlapping lengths of the fingers 11 converge in correspondence with the curves 22. A corresponding convergence, emphasized by the curves 23, is provided in the case of the transducer 3 for the section disposed to the right of the primary section 14.

As is apparent from FIG. 2, the curved shape of the fingers 11 in the primary section 14 is restricted to the intermediate space between the envelopes 15. The curvature (or the respective multi-sided curve) could also be continued to the bus bars 12, 112. However, as shall be apparent from the following further description, this is not necessary for the realization of the invention and, for sections of the transducer 3 disposed outside the envelopes 15 (and also outside the curves 22 and 23) the technically simpler (bent) rectilinearly parallel shape of these exterior ends of the individual fingers 11 and 13 suffices. For the wave propagation, on the one hand and for the technical realizability on the other hand, it is most favorable to extend or allow to continue at least the provided curvature progression of the individual finger 11 and possibly also fingers 13 via the envelopes 15, or the curves 22 and 23 for a certain length. This is done so that for the wave propagation at the transition into the region outside the curves 15 (and 22 and 23) no abrupt change of the physical propagation conditions of the sonic wave is present.

In FIGS. 1 and 2, the system of coordinates x-z is provided in the plane of the arrangement, or in the plane of the substrate 5, respectively. The coordinate origin is placed at the end 21 of the integration electrode 2. With the aid of this system of coordinates, mathematic information for the selection of the respective optimum curvature progression of the individual fingers 11 and for the length of the individual fingers 11, or for the position of the envelopes 15, can be presented in a more readily comprehensible fashion.

Figure 3:
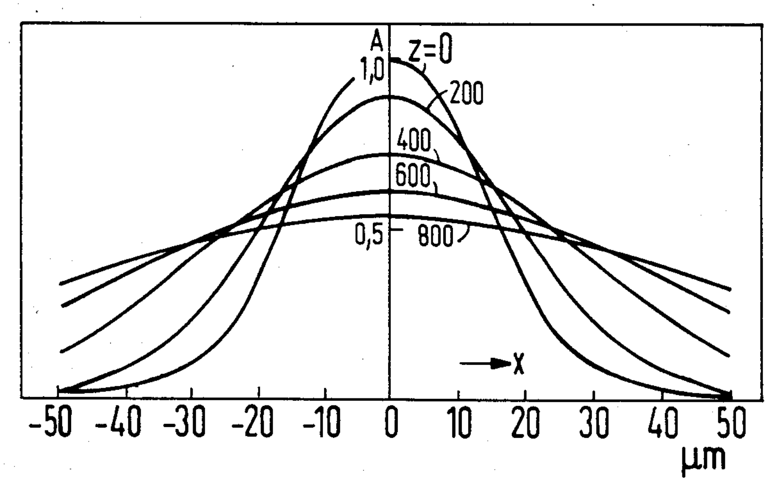
FIGS. 3 through 6 illustrate diagrams which relate to a theoretical explanation and basis of a dimensioning rule for the curvature progression.
Figure 4:
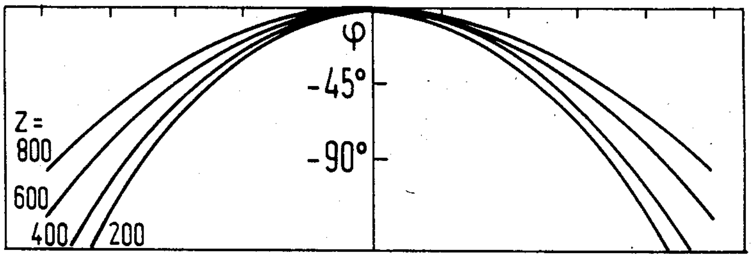

According to the diagram or mathematical model "Angular Spectrum of Waves Theory" known to experts in this art, for the amplitude A and the phase l, diagrams may be provided as shown in FIGS. 3 and 4. FIG. 3 shows the amplitude diagram, and FIG. 4 shows the phase diagram (amplitude and phase are respectively plotted on the ordinate) plotted over the value ±x. The parameter of the individual curves is the quantity z. This is the distance measured parallel to the wave propagation orientation in the arrangement from the end 21 of the integration electrode 2 (see also FIGS. 1 and 2). The distances z are likewise measured in μm. Somewhat different diagrams are obtained for various frequencies. However, the differences e.g. in the range of 100 MHz to 500 MHz are largely negligible in terms of the invention.

For the curvature progression of the fingers 11, the curvature of the wave front, i.e. essentially the diagram of the phase progression, is decisive. The wave fronts are locations of equal phase of the advancing wave.

From the above-indicated diagram, an approximation formula has been determined for the invention which has proven to be a good working basis. This approximation formula reproduces the locations of the curved progression of the wave front. The formula is:

$$\Delta \not\equiv = -\frac{a \cdot \not\equiv \cdot x^2}{z^2 + b} \qquad \text{(I)}$$

and wherein a=0.94 and b=41 810 are constants herein, z is the initial point on the z-axis, and ±x is the distance of a respective line parallel to the z-axis. On this parallel line, the quantity Δz is to be added. The value $\Delta z + z = z'(x)$ then results for the individual location of the wave front given at a distance ±x from the z-axis.

The above-mentioned diagram, in addition, also provides the so-called overlapping integral $$T_p = \frac{|\int a_1 \cdot a_2^* dx|^2}{\int |a_1|^2 dx \cdot \int |a_2|^2 dx} \qquad \text{(II)}$$

Figure 5:
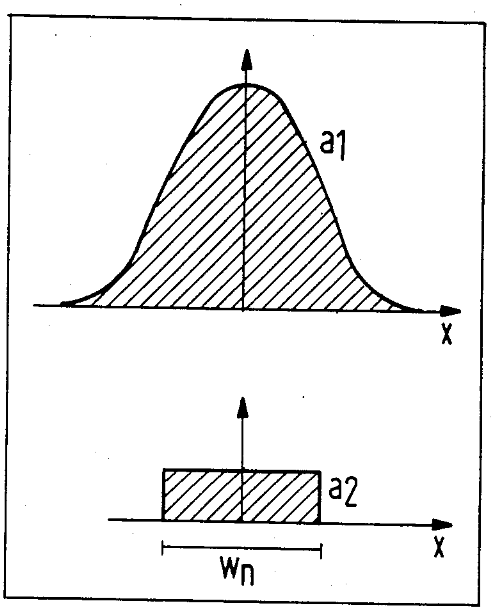

$a_1$ is the complex amplitude according to FIG. 3 for the respective wave at the distance x from the z-axis. For further explanation of this overlapping interval, reference is made to FIG. 5 in which, superimposed and in the upper half of the figure, the already mentioned wave profile is illustrated which results on the basis of the waveguide. The lower half shows for the near field the wave profile of the overlapping length $W_n$ of a pair (n) of fingers 11, which is a rectangular profile with the amplitude $a_2$.

Figure 6:
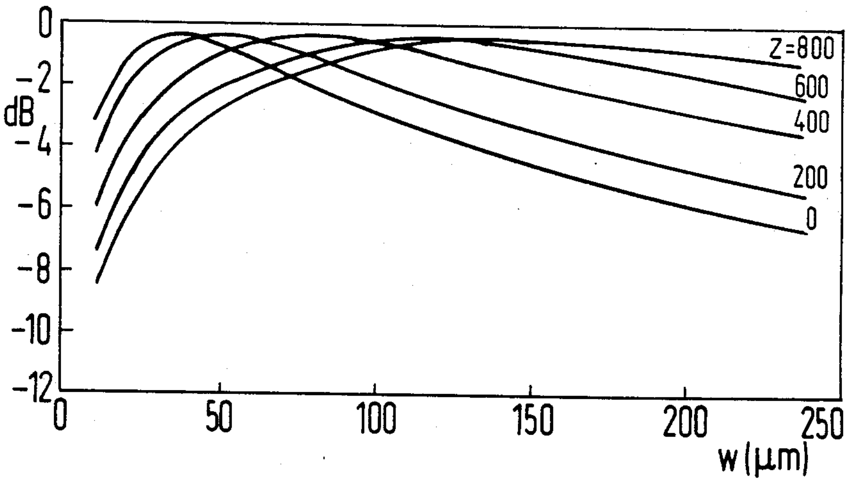

In FIG. 6, the overlapping integral is plotted over the overlapping length w. The parameter of the curve group is again the distance on the z-axis. It is apparent from FIG. 6 that the maximum of the overlapping integral, i.e. the optimum overlapping length for a finger pair (n) for a small distance for small values of z, is small. For greater distances z, greater optimum overlapping lengths result. In FIG. 2, the maximum of the overlapping integral of FIG. 6 is represented by the envelope curve 15. This envelope curve 15 is approximately a hyperbola which, for greater distances z, approximates the width of the integration electrode 15 at the end 21 (z=0).

It is pointed out that the individual fingers 11 can also be designed in the form of split fingers, as are known. The overlapping length on the two sides of a split finger can thus also be selected independently of one another.

On account of the dispersion, in the case of a transducer 3, 4 according to the invention, the above-mentioned compensation can also be provided here.

Although various minor changes and modifications might be proposed by those skilled in the art, it will be understood that I wish to include within the claims of the patent warranted hereon all such changes and modifications as reasonably come within my contribution to the art.

I claim as my invention:

1. A surface acoustic wave convolver arrangement, comprising:

a substrate;

an integration electrode on the substrate acting as a waveguide;

first and second interdigital input transducers which, along with the integration electrode, are aligned along a z-axis corresponding to a wave propagation direction in the convolver arrangement, said interdigital input transducers being respectively arranged at opposite ends of the integration electrode and having their ends opposite the respective ends of the integration electrode;

the input transducers being dispersive transducers and at their ends opposite the integration electrode end having an aperture which is comparably large compared with an aperture of the integration electrode at the respective end;

at least one of the interdigital input transducers having a plurality of fingers wherein adjacent fingers are oppositely poled and wherein the fingers have concave portions deviating from a linear shape when viewed from the end adjacent the respective integration electrode end and the concave portions of said curved fingers having a progression of curvature at least approximately corresponding to the form of a wavefront at the location of each of said respective fingers, said wavefront being associated with a given sonic wave proceeding from said end of the integration electrode towards said plurality of fingers; and a primary section of said respective transducer being provided in which said respectively adjacent and oppositely poled curved finger portions overlap with one another, the extent of overlaps being dimensioned such that a substantially maximum receiving sensitivity is provided for said respective sonic wave proceeding from the end of the integration electrode.

2. An arrangement according to claim 1 wherein for a number of the fingers in the primary section of the transducer, dummy finger sections are provided in line with said combination of the overlapping sections, said dummy finger sections adjacent to one another not overlapping.

3. An arrangement according to claim 1 wherein outside the primary section of the transducer the extent of overlap of adjacent fingers is lessened so that frequency response is smooth.

4. An arrangement according to claim 1 wherein the concave portions are curves.

5. An arrangement according to claim 1 wherein the concave portions are rectilinear segments approximating curves.

6. A surface acoustic wave convolver arrangement, comprising:

a substrate;

an integration electrode on the substrate acting as a waveguide;

first and second interdigital input transducers aligned along a Z-axis together with the integration electrode, said Z-axis corresponding to a wave propagation direction in a convolver arrangement, and said interdigital input transducers being respectively closely arranged and directly adjacent opposite ends of the integration electrode so that an end of the respective input transducer is directly adjacent and closely arranged to the respective ends of the integration electrode;

the input transducers comprising dispersive transducers and at said ends directly adjacent the integration electrode ends having an aperture which is comparably large compared with an aperture of the integration electrode at the respective end;

each of the input transducers having a plurality of fingers wherein adjacent fingers are oppositely poled;

at least one of the interdigital input transducers having some of its fingers deviating from a linear shape by forming these fingers with a linear portion and a concave portion, said concave portion being arranged in a path of a sonic wave front defined by the integration electrode and emitted from the end thereof into the end of the input transducer and wherein in a primary section of the input transducer said concave portions of the fingers are positioned and wherein their shape is defined by a shape of the wave front at the respective locations of each of the finger concave portions such that the shape of the concave portions are defined by the prescribed wave front at the respective fingers within the primary section; and for adjacent and oppositely poled fingers with concave portions, an extent of overlap relative to one another of the concave portions being chosen such that a substantially maximum receiving sensitivity is provided for said respective sonic wave proceeding from the end of the integration electrode.

* * * * *